United States Patent [19]
Haertling

[11] Patent Number: 5,471,721
[45] Date of Patent: Dec. 5, 1995

[54] METHOD FOR MAKING MONOLITHIC PRESTRESSED CERAMIC DEVICES

[75] Inventor: Gene H. Haertling, Central, S.C.

[73] Assignee: Research Corporation Technologies, Inc., Tucson, Ariz.

[21] Appl. No.: 21,367

[22] Filed: Feb. 23, 1993

[51] Int. Cl.⁶ .................................................... H01L 41/22
[52] U.S. Cl. ........................ 29/25.35; 29/854; 310/363; 310/369; 367/164; 427/100
[58] Field of Search ................................... 29/25.35, 854, 29/825; 367/157, 164; 310/363, 365, 367–369; 427/100

[56] References Cited

U.S. PATENT DOCUMENTS

| | | |
|---|---|---|
| 3,447,217 | 6/1969 | Kumada . |
| 3,676,722 | 7/1972 | Schafft . |
| 4,078,160 | 3/1978 | Bost . |
| 4,987,515 | 1/1991 | Iwaya et al. . |
| 4,999,819 | 3/1991 | Newnham et al. . |
| 5,091,820 | 2/1992 | Iwaya et al. . |

FOREIGN PATENT DOCUMENTS

| | | |
|---|---|---|
| 521380 | 1/1993 | European Pat. Off. . |
| 1942769 | 3/1971 | Germany . |

OTHER PUBLICATIONS

P. Atherton, "Technology Trends, Micropositioning Using Piezoelectric Translators", *Photonics Spectra*, pp. 51–54 (1987).
K. Uchino, "New Monolithic Actuators, Monomorphs, Using Semiconductor Ferroelectrics", *Yogyo–Kyokai–Shi*, vol. 95, pp. 722–735 (1987).
R. E. Newnham et al., "Flextensional Transducers", *ONR Transducer Materials Review, Abstract Booklet* (1992).
K. Uchino, "Actuators Studies", *ONR Transducer Materials Review, Abstract Booklet* (1992).
G. H. Haertling, "Kinetics of the Reduction of Lead Compounds and Glasses", *J. of Amer. Ceramic Soc.*, vol. 48, No. 1, pp. 35–40 (1965).
G. H. Haertling, "Ferroelectric Thin Films For Electronic Applications", *J. Vac. Sci. Technol. A.*, vol. 9, pp. 414–420 (1991).
G. H. Haertling, "Current Status of Thin/Thick Film Ferroelectrics", *Ferroelectric Films*, pp. 1–18 (1980).
G. H. Haertling, "Piezolectric and Electrooptic Ceramics", *Ceramic Material For Electron Process, Prep. and Appl.*, pp. 139–225 (1986).
G. H. Haertling, "Reduction/Oxidation Effects in PLZT Ceramics", *4th International SAMPLE Electronics Conference*, pp. 669–7711 (1990).
G. H. Haertling, "Photoelectronic Effects in PLZT Ceramics", *Electro–Optics & Nonlinear Optics*, pp. 21 . 50.
C. E. Land, "Electrooptic Ceramics", *Appl. Solid State Science*, vol. 4, pp. 137—233 (1974).

(List continued on next page.)

*Primary Examiner*—Carl E. Hall
*Attorney, Agent, or Firm*—Scully, Scott, Murphy & Presser

[57] ABSTRACT

Monolithic, internally asymmetrically stress biased electrically active ceramic devices and a method for making same is disclosed. The first step in the method of the present invention is to fabricate a ceramic element having first and second opposing surfaces. Next, only the first surface is chemically reduced by heat treatment in a reducing atmosphere. This produces a concave shaped, internally asymmetrically stress biased ceramic element and an electrically conducting, chemically reduced layer on the first surface which serves as one of the electrodes of the device. Another electrode can be deposited on the second surface to complete the device. In another embodiment of the present invention two dome shaped ceramic devices can be placed together to form a completed clamshell structure or an accordion type structure. In a further embodiment, the clamshell or accordion type structures can be placed on top of one another. In another embodiment, a pair of dome shaped ceramic devices having opposing temperature characteristics can be placed on top of each other to produce an athermalized ceramic device.

21 Claims, 9 Drawing Sheets

OTHER PUBLICATIONS

G. H. Haertling, "Recent Developments in Bulk and Thin Film PLZT Materials and Devices", *Ferroelectrics*, vol. 131, pp. 1–12 (1992).

G. H. Haertling, "PLZT Electrooptic Materials and Applications—A Review", *Ferroelectrics*, vol. 75, pp. 25–55 (1987).

G. H. Haertling, "Ceramic Superconducting Components" *Superconductivity II*, pp. 537–545.

FIG. 8
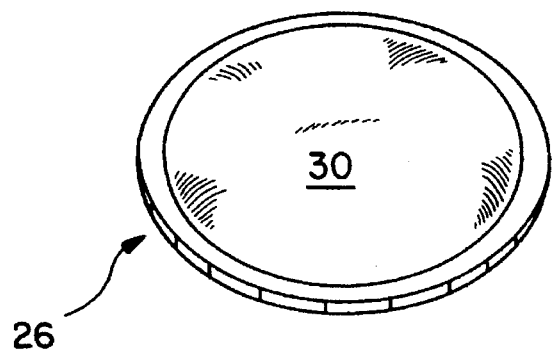
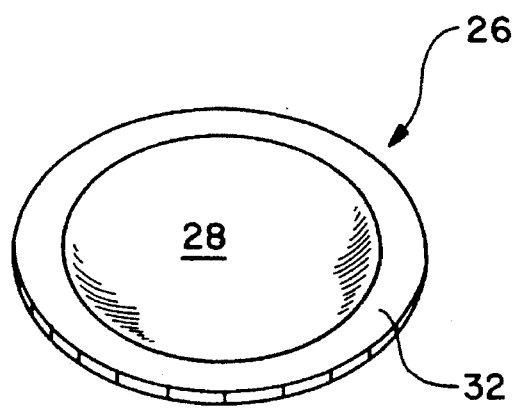
FIG. 9
FIG. 10
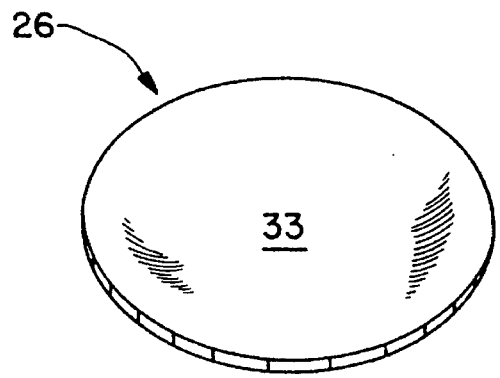

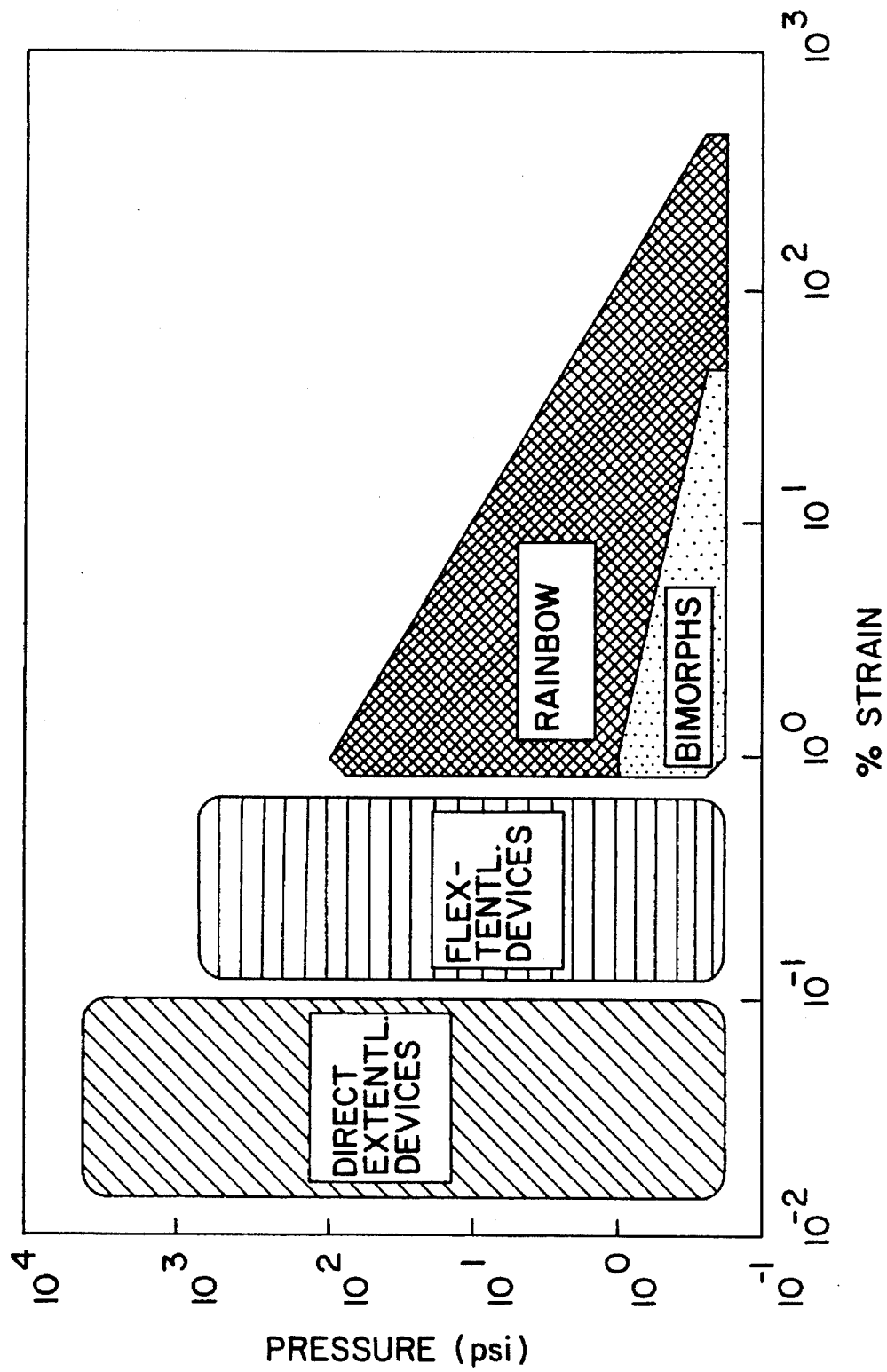

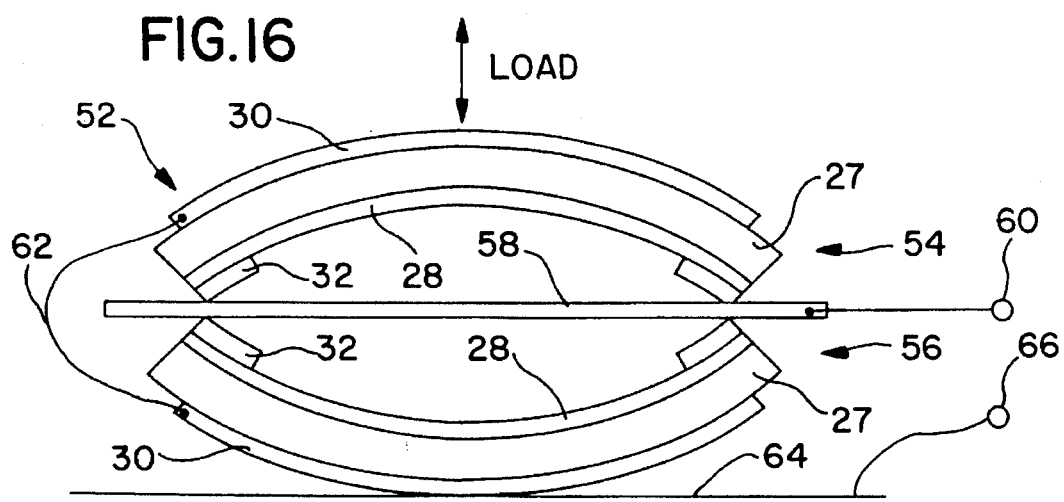
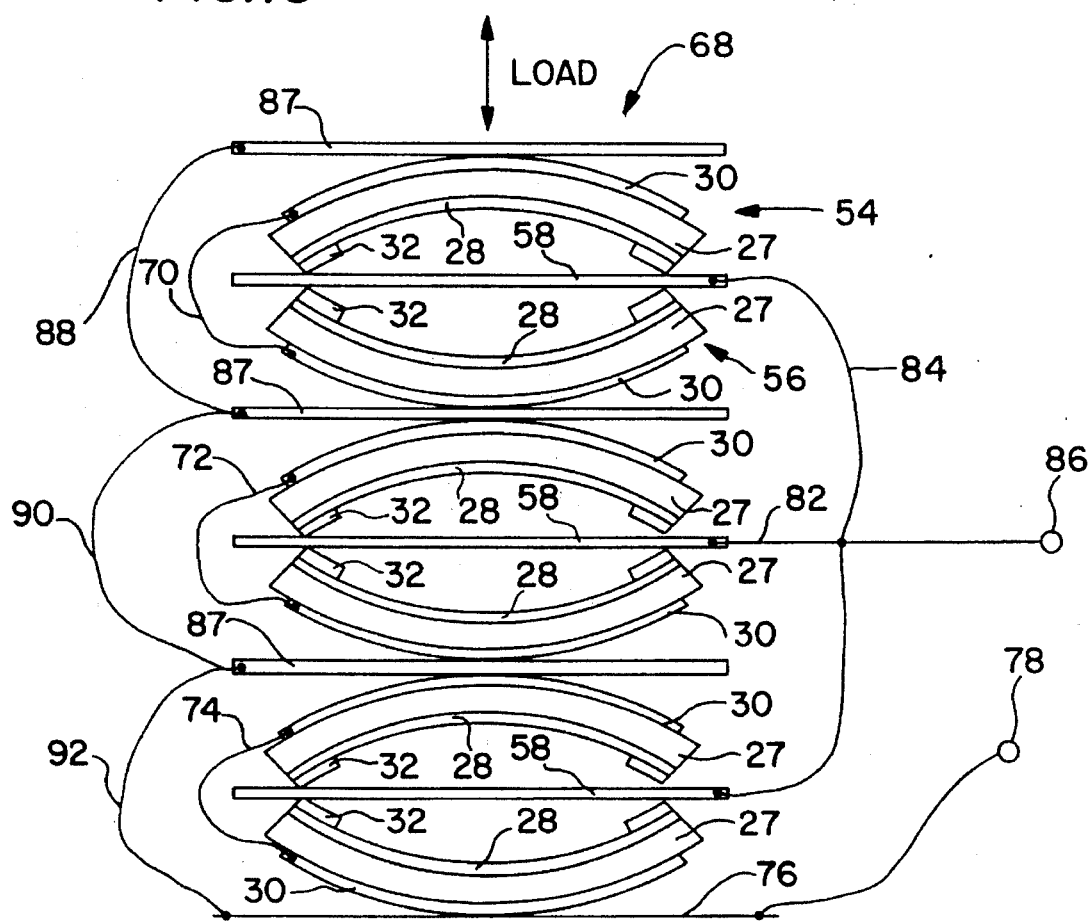

METHOD FOR MAKING MONOLITHIC PRESTRESSED CERAMIC DEVICES

BACKGROUND OF THE INVENTION

1. Field of the Invention

The present invention relates generally to electrically active ceramic devices and, more particularly, to a method for making monolithic internally asymmetrically stress biased piezoelectric or electrostrictive devices having an integral electrode and the devices formed thereby.

2. Description of the Prior Art

Piezoelectric and electrostrictive materials develop a polarized electric field when placed under stress or strain. Conversely, they undergo dimensional changes in an applied electric field. The dimensional change (i.e., expansion or contraction) of a piezoelectric or electrostrictive material is a function of the applied electric field. Piezoelectric and electrostrictive materials can possess a large number of combined and useful properties such as piezoelectric (electric field dependent strain), electrostrictive, dielectric, pyroelectric (temperature dependent polarization), ferroelectric (electric field dependent polarization) and electrooptic (electric field dependent optical birefringence).

Recently, electrostrictive devices have generated considerable interest because of their increased strain under sizable loads as well as not requiring high voltages. In addition, modification of piezoelectric device geometries to increase achievable strain are also of interest. These devices have a wide range of applications which include actuators, pumps, speakers, sensors, switches, hydrophones, hydrospeakers, adaptive optics, variable focus mirrors and lenses, vibrators, benders, accelerometers, strain gauges and saddle inchworms.

Under an applied electric field, a piezoelectric crystal deforms along all its axes. It expands in some directions and contracts in others. The piezoelectric or strain coefficient describing this deformation is commonly denoted by the tensor $d_{ij}$.

$$d_{ij} = x/E_i \text{ (constant } X\text{)} = P_i/X_j \text{ (constant } E\text{)}$$

where x equals strain (extension per unit length); X equals stress (force per unit area); E equals electric field (volts per meter), and P equals polarization (Coulombs per square meter). The subscripts i,j refer to the crystal axes, or in the case of ceramics, to the direction of polarization of the ceramic. For example, $d_{31}$ is the strain coefficient in the lateral direction while $d_{33}$ is the strain coefficient for the longitudinal direction.

A typical ceramic device such as a direct mode actuator makes direct use of a change in the dimensions of the material, when activated, without amplification of the actual displacement. The direct mode actuator includes a piezoelectric or electrostrictive ceramic plate sandwiched between a pair of electrodes formed on its major surfaces. The device is generally formed of a material which has a sufficiently large piezoelectric and/or electrostrictive coefficient to produce the desired strain in the ceramic plate. By applying a voltage of appropriate amplitude and polarity between some dimensions of the device, it will cause the piezoelectric (or electrostrictive) material to contract or expand in that direction. When the device expands or contracts in one dimension (the thickness or longitudinal direction) it generally contracts or expands respectively, in dimensions in a plane perpendicular thereto (planar or transverse directions).

Direct mode actuators utilize either the longitudinal extensional mode or lateral extensional mode and are capable of sustaining high loads under compression (in excess of 1000 lbs. on a ¾ inch rod under an applied electric field of 25 V/mil). However, direct mode actuators suffer from the disadvantage of a very small displacement (strain) that they are able to achieve which is at best a few tenths of a percent.

Indirect mode actuators achieve strain amplification via external structures. An example of an indirect mode actuator is a flextensional transducer. Flextensional transducers are composite structures composed of a piezoelectric ceramic element and a metallic shell, stressed plastic or fiberglass structure. The actuator movement of conventional flextensional devices commonly occurs as a result of expansion in the piezoelectric material which mechanically couples to an amplified contraction of the device in the transverse direction. In operation, they can exhibit up to about 0.5% strain at ±25 V/mil applied electric field and can sustain loads up to several hundred pounds.

Recently, a new type of flextensional transducer called a "moonie" has been developed. For example, U.S. Pat No. 4,999,819 discloses a transducer which includes an electroded piezoelectric plate bonded to and sandwiched between two metal plates each having a concave cavity. Moonie's provide better performance and larger displacements than conventional flextensional transducers. For example, under an applied field of 25 V/mil, a two layer moonie with a total thickness of about 148 mils can exhibit a displacement of 1.5 mils (1.02% strain). However, as a result of its ability to sustain more strain than a conventional transducer, moonies can only sustain loads which are less than 100 lbs.

Other examples of indirect mode actuators include the unimorph, bimorph, multimorph and monomorph actuators. A typical unimorph is composed of a single piezoelectric element externally bonded to a flexible metal foil which is stimulated by the piezoelectric element when activated with a changing voltage and results in an axial buckling or deflection as it opposes the movement of the piezoelectric element. The actuator movement for a unimorph can be by contraction or expansion. Unimorphs can exhibit a strain of as high as 10% but can only sustain loads which are less than one pound.

A conventional bimorph device includes an intermediate flexible metal foil sandwiched between two piezoelectric elements bonded to the plate. Electrodes are bonded to each of the major surfaces of the ceramic elements and the metal foil is bonded to the inner two electrodes. A multilayer device known as a multimorph can be made by stacking alternating layers of ceramic elements and metal plates. When a voltage is applied to the electrodes, the bimorph or multimorph bends or vibrates. Bimorphs and multimorphs exhibit more displacement than unimorphs because under the applied voltage, one ceramic element will contract while the other expands. Bimorphs and multimorphs can exhibit strains up to 20% at 25 V/mil but as with unimorphs, cannot sustain loads greater than one pound.

A typical monomorph bender includes a piezoelectric plate with conductive electrodes disposed on each side thereof and is capable of bending similar to a bimorph. However, the bend in a monomorph is realized by a non-uniform electric field distribution in the piezoelectric plate. Monomorphs can exhibit strains up to 15% at 1 KV/mm but cannot sustain loads greater than approximately one pound.

Although the above indirect bending mode actuators can exhibit larger strains than direct mode actuators, the indirect mode actuators have very small load bearing capacities. In addition, the load bearing capacity of indirect mode actuators generally decreases as the achievable strain increases. Thus, there is a need to develop a piezoelectric or electrostrictive device that can produce large strains and sustain moderate loads.

The piezoelectric or electrostrictive sheets or elements used in the above devices can be fabricated by a number of methods, two of the most widely used which are atmosphere sintering and hot pressing. The metallic electrodes used for each of the above devices are typically deposited on the ceramic element. However, by utilizing a reduction process, the electrodes can be formed by chemically reducing the entire flat ceramic element by heat treatment in a carbon monoxide reducing atmosphere to produce a flat ceramic element having integral electrodes on each major surface. For example, Haertling (1990) *4th Int'l SAMPE Electronics Conference,* pp. 699–711 discloses a method for chemically reducing two major surfaces of a lead lanthanum zirconate titanate (PLZT) wafer by carbon monoxide reduction at temperatures between 600° C. and 1000° C. This produces a flat PLZT wafer having integral conductive electrodes on each major surface. The center of the element is a dielectric, and the PLZT wafer does not possess any asymmetrical internal compressive stress, nor can it produce any out-of-plane displacement.

U.S. Pat. Nos. 5,091,820 and 4,987,515 disclose a cylindrical ceramic core such as lead zirconate titanate (PZT) (PZT is a registered trademark of Vernitron, Inc.) having an integral electrode formed on each opposing end face of the core. The electrodes are formed by reducing the entire core in an atmosphere of hydrogen or nitrogen at a temperature between 650° C. to 1000° C. This produces a reduced metallic layer over the entire core. The reduction layer on the column surface of the core is removed leaving the two reduced electrodes on opposing end faces of the core. However, since the entire ceramic core is reduced, this process does not produce an internal stress bias nor does it alter the original shape of the core.

U.S. Pat. No. 3,676,322 discloses a bimorph bender which includes a corrugated conductive center vane sandwiched between a pair of concave shaped ceramic wafers. Each wafer has conductive electrodes affixed to both sides thereof. The center vane is constructed to have its greatest stiffness at the center of the bimorph and its stiffness continuously decreases to where it is least at the circumference of the bimorph. As a result, the composite stiffness of the bimorph tends to overcome mechanical hysteresis because the center vane provides a restoring force which tends to overcome the natural resilience of the material and return the bimorph to its initial orientation as the driving signal goes through its zero crossings. In the fabrication method, after a flat circular ceramic wafer is made, the wafers are mechanically stressed into the concave configuration so that they can enclose the center vane. Next, the electrodes are deposited on each major surface of the ceramic element. Thus, the ceramic wafers do not have an integral electrode, do not possess any asymmetrical internal stress, the fabrication process is a complicated one and a corrugated conductive center vane is required to have less mechanical hysteresis than prior art flat wafers with a center vane of uniform thickness.

U.S. Pat. No. 3,447,217 discloses reduction/reoxidation methods for fabricating piezoelectric vibrators. One method comprises exposing a PZT sheet to a stream of hydrogen gas at a temperature of 800° C. for 15 minutes to reduce the entire sheet. Next, the sheet is oxidized for 2 hours at 650° C. in a stream of oxygen gas. This method produces an integral flat-shaped piezoelectric vibrator which comprises a reduced layer sandwiched between a pair of oxide layers. In another embodiment two flat elements are reduced and then one surface of each element is protected from reoxidation so that only one surface of the element is oxidized. This produces a flat element wherein one surface is reduced and the other is oxidized. As a result, these processes do not produce an asymmetrical internally stress biased concave shaped piezoelectric element.

Thus, there is a need to develop a piezoelectric or electrostrictive device that can produce relatively large strains and sustain moderate loads. There is also a need to develop such a device with an asymmetrical internal stress bias to provide above-plane axial displacement and increase mechanical strength. In addition, there is a need for a simplified fabrication process to produce such electrically active ceramic devices.

SUMMARY OF THE INVENTION

The present invention is directed to a method for fabricating monolithic, internally asymmetrically stress-biased electrically active ceramic devices and the devices formed thereby. As a result of the asymmetrical internal stress bias, the ceramic devices of the present invention can provide above-plane axial displacement and increased mechanical strength. The ceramic devices of the present invention can produce large displacements (strain) and sustain moderate loads. The first step of the present method is to fabricate a ceramic element having first and second opposing surfaces by any well known method such as hot pressing or atmosphere sintering. The wafer can be made up of a piezoelectric or electrostrictive material such as lead zirconate titanate (PZT), lead lanthanum zirconate titanate (PLZT), lead stannate zirconate titanate (PSZT), lead barium zirconate titanate (PBZT) and lead magnesium niobate (PMN). The starting wafer can also have a wide range of shapes including circular, rectangular and square.

The next step of the method of the present invention is to chemically reduce only one surface of the wafer by heat treatment in a reducing atmosphere of a reducing agent. The reducing agent can be one that reduces a portion of the lead oxide in the wafer to its metallic state. Examples of such reducing agents include graphite (carbon), carbon monoxide, hydrogen or any other suitable reducing agent that reduces lead oxide to its metallic state. During this step, only one surface of the wafer is subjected to the reducing atmosphere while the other surface is left exposed or is protected from the reducing atmosphere by a mask. For example, for carbon monoxide reduction, the wafer can be placed on a carbon block or between a carbon block and a masking block (e.g., zirconia). During heat treatment only the surface in contact with the carbon block will be exposed to the reducing carbon monoxide atmosphere.

The method of the present invention produces a wafer wherein the first surface becomes a metallic/conductive reduced form of the ceramic material. In addition, the present method produces a concave shaped wafer due to (1) volume shrinkage of the reduced material with respect to the unreduced material and (2) the difference in thermal expansion between the reduced side and the dielectric (unreduced) side. As a result of the concave shape, the reduced side is in tension while the dielectric side is in compression at zero applied field. The net effect of the present method is to place the electrically active side (dielectric side) of the wafer in compression which is the most desirable configuration for reliability, load bearing capability and long life. The asymmetrical internal stress bias of the present ceramic wafer also increases mechanical strength and creates out-of-plane displacement. This provides mechanical overload protection for the devices of the present invention; i.e., excessive loads simply cause the ceramic wafer to bottom out onto the planar surface rather than fracturing. Furthermore, a fully integrated, monolithic device is created.

The reduced side of the wafer serves as a mechanical substrate and an electrically conductive base electrode. Consequently, a metallic electrode need only be deposited on the dielectric side of the wafer. Alternatively, a metallic electrode can also be deposited on the reduced layer or a perimeter thereof to assure good electrical contact under high speed operation. After attaching leads to the two electrodes, the device is ready for operation.

The piezoelectric and electrostrictive ceramic devices of the present invention possess a number of useful properties including pyroelectric, ferroelectric and electrooptic in addition to their piezoelectric or electrostrictive properties. As a result, the electrically active ceramic devices of the present invention can be used for a wide variety of applications.

When a circular wafer is used, the method of the present invention produces a dome shaped ceramic wafer. Two of these dome shaped devices can be placed together to form a completed clamshell structure. An adhesive can be used around the inner perimeter of each shell but this is not required. These two devices can be operated in series to produce twice the displacement of one device. As an alternative embodiment, each dome shaped wafer can have opposing temperature characteristics such that when combined in a clamshell structure, they produce an athermalized device. This embodiment results in a temperature stabilized device. As a further embodiment, the clamshell structures either athermalized or not can be placed on top of one another to form a pump or motor of high linear displacement in a very small volume.

In a further embodiment of the present invention, dome shaped wafers of the present invention can be placed on top of each other with each wafer having the same orientation (e.g., reduced side of each wafer facing down), and a rigid sheet disposed therebetween. Additional domed shaped wafers along with a rigid sheet between each additional wafer can be added to form an accordion type structure. As with the clamshell devices, the wafers can be grouped in pairs of two with opposing temperature/strain characteristics to form an athermalized device. This embodiment can also be used to form a pump or motor of high linear displacement in a very small volume.

The electrically active ceramic devices of the present invention provide a monolithic, prestressed concave shaped construction which makes it able to produce high displacements and sustain moderate loads. The present ceramic device can produce strains up to several hundred percent (an order of magnitude greater than the best bimorphs) and sustain loads of at least 10 pounds (an order of magnitude better than the best bimorphs). The present invention provides a simple and cost effective method for producing the electrically active ceramic devices. In addition, the present invention is surface mountable, has a low inventory of parts, no bonding requirement, highly flexible, multifunctional and can be used in a variety of devices.

BRIEF DESCRIPTION OF THE DRAWINGS

FIG. 8 is a top perspective view of the electrically active ceramic device of the present invention with an electrode disposed on the dielectric side.

FIG. 9 is a bottom perspective view of the ceramic device of FIG. 8 further having an electrode disposed on a perimeter of the reduced layer.

FIG. 10 is a bottom perspective view of an alternative embodiment of the device of FIG. 8 further having an electrode disposed on the entire reduced layer.

FIG. 15 is a comparison of the strain and pressure of conventional actuators and the electrically active ceramic device of the present invention.

FIG. 16 is a cross-sectional view of a pair of electrically active ceramic devices of the present invention operating as a single clamshell structure.

FIG. 18 is a cross-sectional view of multiple pairs of ceramic devices of the present invention operating as a single unit.

DETAILED DESCRIPTION OF THE INVENTION

Figure 1:
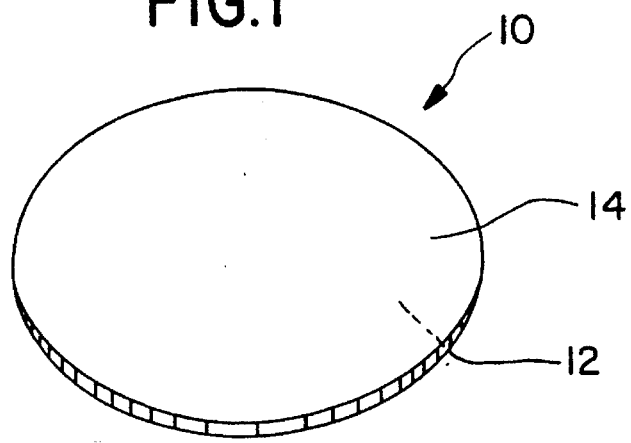
FIG. 1 is a top perspective view of a ceramic wafer before being fabricated according to the present invention.
Figure 2:
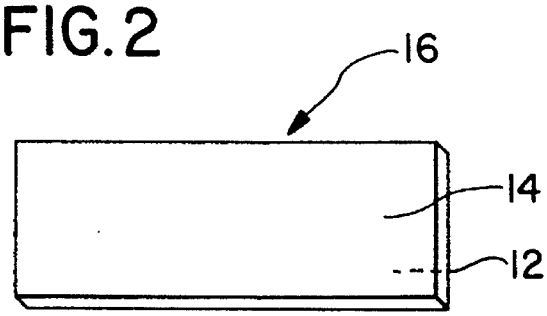
FIGS. 2–4 are top perspective views of further embodiments of ceramic elements before being fabricated according to the present invention.
Figure 3:
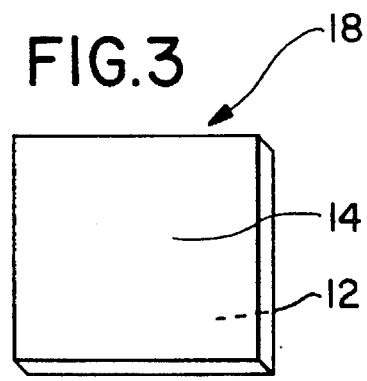
Figure 4:
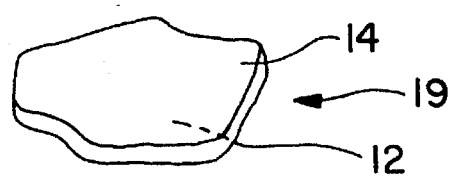

Referring to FIG. 1, there is shown a ceramic wafer 10 prior to being fabricated into a device according to the present invention. The wafer 10 is a planar circular wafer of a piezoelectric or electrostrictive material having first and second major surfaces 12 and 14, respectively. Although the wafer 10 has a circular shape, other shapes can also be used such as rectangular 16, square 18, or any other irregular or odd configuration 19 as shown in FIGS. 2–4.

The first step of the method of the present invention is to fabricate the piezoelectric or electrostrictive wafer 10, 16 or 18 by any well known method such as, for example, hot pressing or atmosphere sintering. These methods are well known in the art and the details are described in Haertling, "Piezoelectric and Electrooptic Ceramics", Ceramic Materials for Electron Process Prop. and Appl." (1986) pp. 169–174. For example, fabricating the wafer 10 by chemical co-precipitation and hot pressing, requires high-purity liquid organometallics (tetrabutyl zirconate and tetrabutyl titanate) to be premixed with PbO in a high speed blender and then precipitated by adding lanthanum acetate, water soluble solution while blending. The resulting slurry is dried to completion at approximately 80° C. Subsequent steps in the process include (1) calcining the powder, (2) wet milling the powder for several hours to promote additional homogeneity, (3) drying without binder, (4) cold pressing the powder, (5) hot pressing in oxygen and (6) shaping and slicing.

A typical atmosphere sintering (mixed oxide) process for fabricating a PLZT wafer includes (1) weighing the oxides ($La_2O_3$, $ZrO_2$, $TiO_2$, PbO) to the appropriate accuracy, (2) blending in a liquid medium, (3) drying to completeness, (4) calcining the powder, (5) milling in a liquid medium, (6) drying with binder addition, (7) cold pressing a specific shape, (8) high temperature firing (sintering) and (9) shaping.

Suitable materials for ceramic wafer 10 include high lead containing piezoelectric or electrostrictive materials such as lead zirconate titanate (PZT), lead lanthanum zirconate titanate (PLZT), lead stannate zirconate titanate (PSZT), lead barium zirconate titanate (PBZT) and lead magnesium niobate (PMN).

The next step of the present method is to chemically reduce only one surface of the wafer 10 by heat treatment in a reducing atmosphere of a reducing agent that reduces lead oxide in the wafer to its conductive/metallic state (lead). Suitable reducing agents include graphite (carbon), carbon monoxide, hydrogen or other suitable reducing agent that will extract oxygen atoms from the surface being reduced. During this step, only one surface of the wafer 10 is subject to the reducing atmosphere while the opposing surface is not exposed to the reducing atmosphere.

Figure 5:
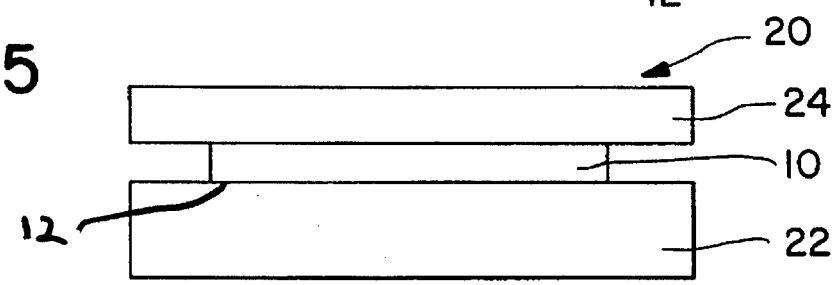
FIG. 5 is a cross-sectional view of an assembly for fabricating the electrically active ceramic devices of the present invention utilizing carbon monoxide reduction.

As an illustrative example, FIG. 5 shows an assembly 20 for preparing the electrically active ceramic devices of the present invention utilizing carbon monoxide reduction. The wafer 10 is placed between a carbon block 22 and a masking block 24 which can be a zirconia or a magnesia block. One or both of the surfaces 12, 14 of wafer 10 can be polished or lapped before being placed between the blocks. The carbon block 22 will be used to reduce the first surface 12 while the optional masking block 24 is used to prevent the second surface 14 from being reduced. It should be noted that the masking block 24 is not necessary since the only surface exposed to the reducing atmosphere is the first surface 12.

Next, the assembly 20 is placed into a furnace and heated. A reducing gas is added to the furnace. The assembly is heated at a temperature between 600° C. and 1200° C. for a time ranging from 5 minutes to 24 hours. Generally, the lower temperatures require the longer reduction times. As an illustrative example, a PLZT 5.5/56/44 wafer can be fabricated by heating the assembly at 975° C. for 60 minutes. (The notation 5.5/56/44 is well known in the art and corresponds to the precursor materials for fabricating a PLZT wafer—%lanthanum/lead zirconate/lead titanate ratio.) It should be understood by those skilled in the art that the present method can be applied to wafers having different chemical ratios for the precursor materials and can be of varying thickness and diameter. The present method can be applied to wafers having a thickness between 0.5 and 500 mils and a diameter between about 0.05 and 10,000 mils.

Figure 6:
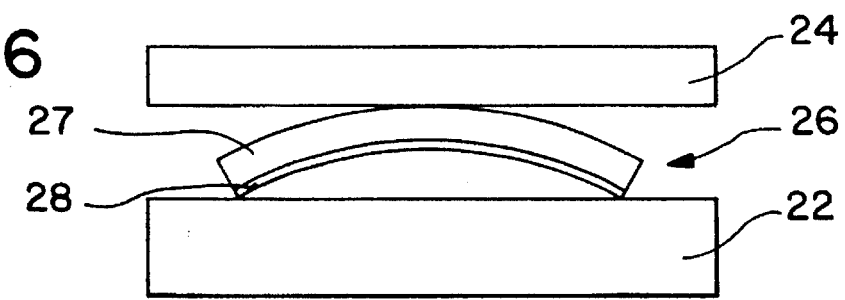
FIG. 6 is the assembly of FIG. 5 after fabrication according to the method of the present invention.

Referring now to FIG. 6, upon cooling, the method of the present invention produces a concave, substantially saddle shaped or substantially dome shaped wafer 26 which includes dielectric layer 27 (i.e., layer 27 is unreduced and remains the piezoelectric or electrostrictive material of wafer 10) and chemically reduced layer 28. Whether the present method produces a concave, saddle or dome shaped depends on the thickness/diameter ratio of the starting wafer. The reduced layer 28 consists of metallic lead finely distributed therethrough as a result of oxygen atoms being extracted from layer 28 during the reduction process resulting in an integral conductive layer 28. At a given temperature, the longer the wafer is subject to the heat treatment the thicker will be the reduced layer 28. For example, at a reduction temperature of 975° C., at 60 minutes the reduced layer will have a thickness of approximately 6 mils while at 125 minutes it will have a thickness of approximately 12 mils. It should be noted that a thin oxide layer forms on the reduced layer 28 as a result of the reduction process. However, this thin layer can easily be removed by light abrasion such as sand paper.

The doming effect is caused by (1) the volume shrinkage of the reduced material with respect to the unreduced material and (2) the difference in thermal expansion between the reduced layer 28 (higher thermal expansion) and the dielectric layer 27 (lower thermal expansion). The net effect of the present method is to place the piezoelectrically active side 27 of the wafer in compression which is the most desirable configuration for reliability, load bearing capability and long life. The reduced side 28 is in tension. As a result, the present method produces a wafer 26 having an asymmetrical internal stress bias which provides increased mechanical strength and above-plane axial displacement. Thus, the process of the present invention produces a Reduced And Internally Biased Oxide Wafer (RAINBOW). The RAINBOW device is a monolithic, asymmetrically internally stressed biased electrically active ceramic element with an integral electrode 28. In addition, the RAINBOW devices are bipolar devices.

In the assembly 20 described above, the carbon block 22 generates carbon monoxide reducing gas according to the reactions:

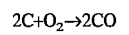

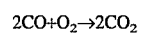

In addition, lead oxide on the first major surface 12 is reduced according to the reaction:

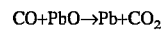

The reduction process extracts oxygen atoms from the crystalline lattice of the piezoelectric or electrostrictive wafer 10 producing excess electrons which are responsible for the increased electrical conductivity of the reduced layer 28 along with the presence of precipitated metallic lead which is finely distributed throughout the reduced layer 28.

Figure 7:
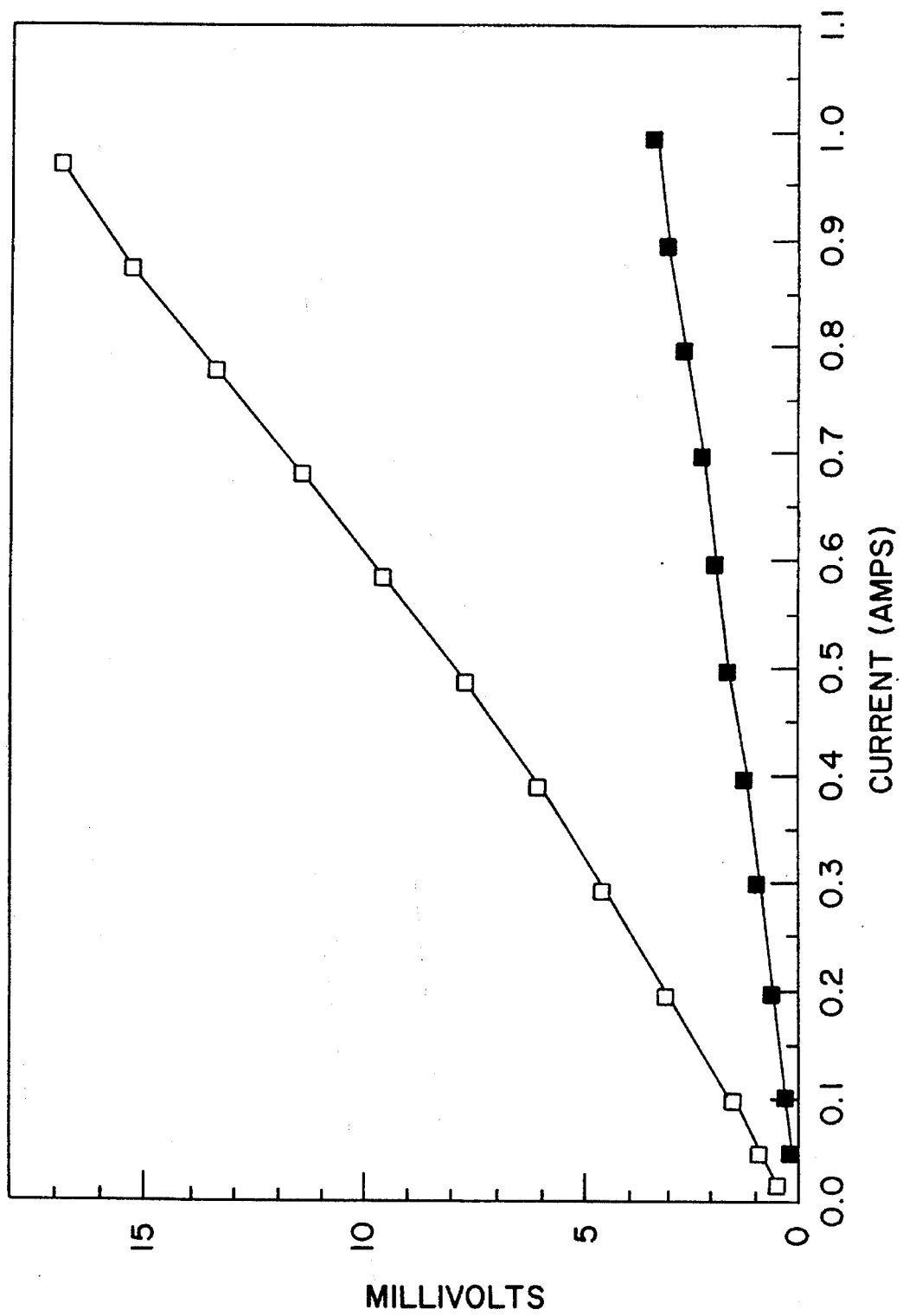
FIG. 7 is a graph of the ohmic characteristics of the reduced layer of two PLZT electrically active ceramic devices of the present invention.

Referring now to FIG. 7, the ohmic characteristics of two PLZT wafers reduced according to the present invention are shown. For the PLZT 5/56/44 sample, it was treated for 60 minutes at 975° C. and yielded a resistance of 75.3 ohms and a resistivity of $3.83 \times 10^{-4}$ ohm-cm. For the 9/65/35 sample it was treated at 1000° C. for 180 minutes and yielded a resistance of 3 ohms and a resistivity of $3.75 \times 10^{-4}$ ohm-cm. Typically, the resistivity of the reduced metallic layer 28 can range between 1 ohm-cm and $1 \times 10^{-3}$ ohm-cm. These low resistivities show that the reduced layer 28 can be an excellent electrically conductive electrode.

The reduced layer 28 serves as a mechanical substrate and a conductive base electrode. As a result, as shown in FIG. 8, a metallic electrode 30 need only be deposited or applied to the dielectric side 27 of the wafer 26 by any suitable method such as screen printing, spraying, painting or vacuum deposition. Alternatively, as shown in FIG. 9, a metallic electrode 32 can also be deposited on a perimeter of the reduced layer 28 or as shown in FIG. 10, a metallic electrode 33 can be deposited over the entire surface of reduced layer 28 to assure good electrical contact under high speed operation. For piezoelectric transducer applications, use of the reduced layer 28 as the stress biasing substrate as well as one of the electrodes effectively eliminates the bonding problem usually encountered in conventional transducer operation.

Figure 11:
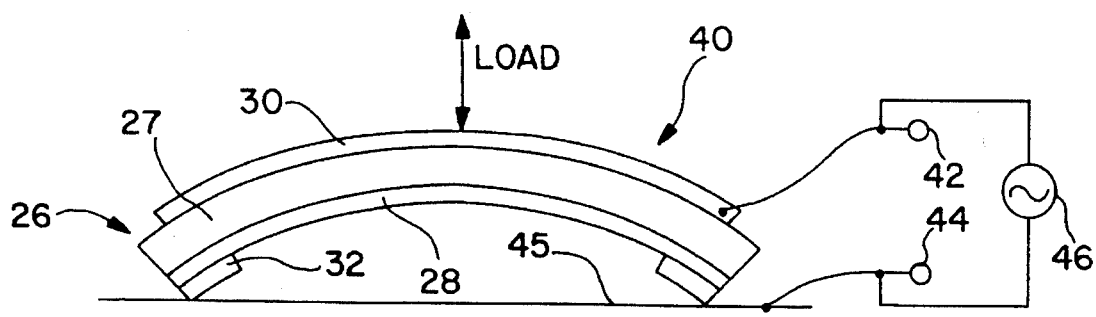
FIG. 11 is a cross-sectional view of an electrically active ceramic device of the present invention operating as an actuator.

Referring now to FIG. 11, there is shown a typical operating piezoelectric device 40 of the present invention. The device 40 includes wafer 26 having electrodes 30, 32 deposited on dielectric and reduced surfaces 27, 28 respectively. Wire leads connect terminals 42 and 44 to electrodes 30 and 32 respectively to provide electrical contact to device 40. The electrode 32 is connected to wire lead 44 by means of metallic base 45. A voltage source 46 is used to apply a voltage to the device 40. When a DC voltage is applied to terminals 42 and 44, the wafer 26 will become substantially flat. Conversely, when the DC voltage is removed, the wafer returns to the concave shape shown in FIG. 11. Thus, the ceramic device of the present invention provides out-of-plane axial displacement where the plane is represented by surface 45. This provides the mechanism for utilizing device 40 as, for example, an actuator, pump, sensor, speaker or microphone.

As an illustrative example, when the voltage source 46 provides an AC or pulsed DC voltage across terminals 42 and 44 such as that of a radio or microphone, the device 40 will vibrate at a frequency equal thereto. Thus, if a load is applied to the dielectric side 27 such as a core of a loudspeaker, the alternating electrical signals can be converted into mechanical vibrations which moves the core of the loudspeaker thus producing sound.

The electrically active ceramic devices of the present invention can produce high displacements and sustain moderate loads. In addition, an increase in voltage generally yields an increase in strain. The ceramic device of the present invention can produce displacements between about 0.1 and 100 mils at an applied field between ±1 V/mil and ±200 V/mil. For example, for the device of FIG. 11 made of PLZT, 9/65/35 having a 10 mil thickness, an electric field of ±5 V/mil yields a 10% strain (1 mil displacement) while a field of ±25 V/mil yields 500% strain (50 mil displacement).

Figure 12:
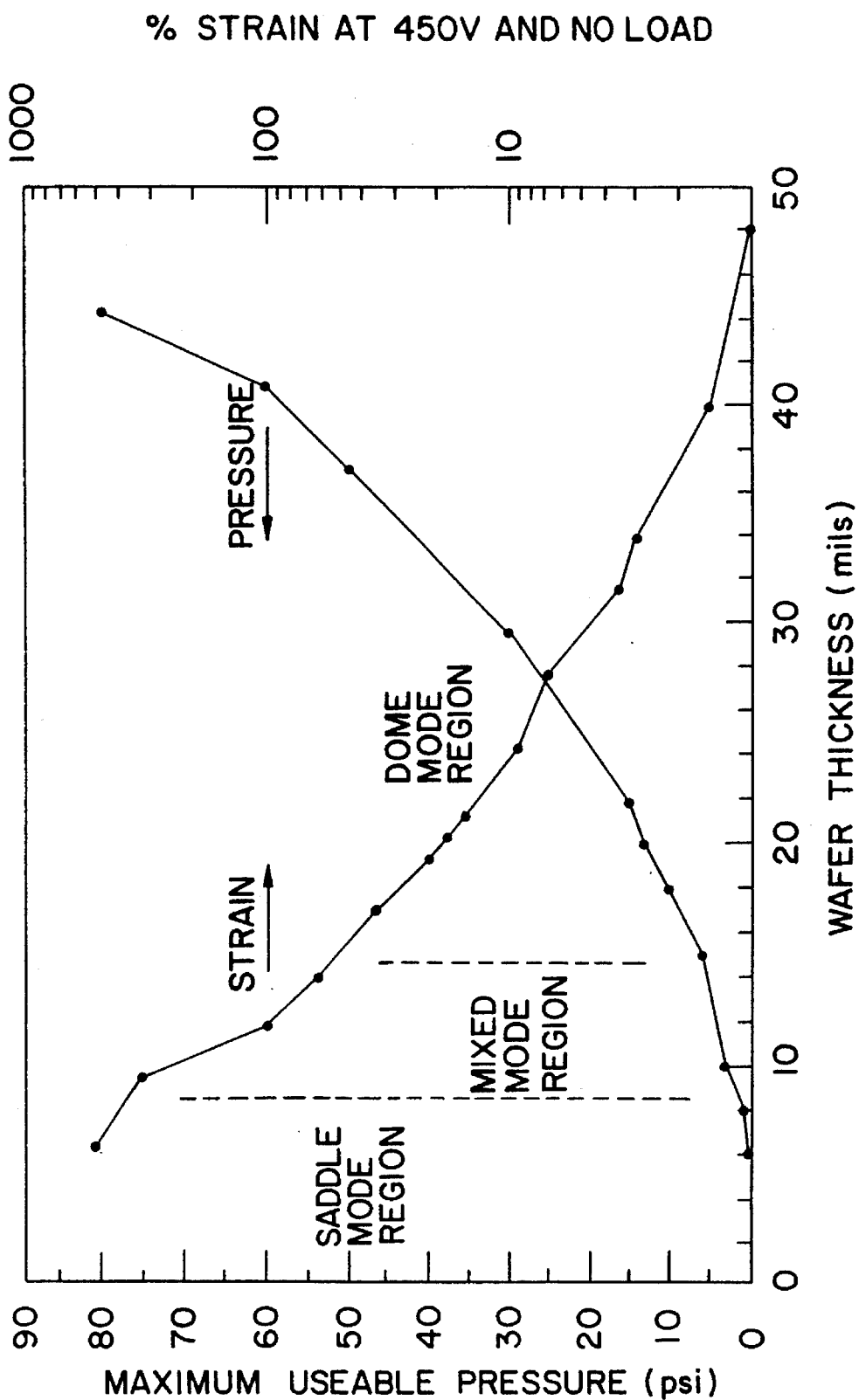
FIG. 12 is a graph of the pressure and strain characteristics of a series of electrically active ceramic devices according to the present invention.

Turning to FIG. 12, there is shown a graph of the % strain and maximum usable pressure (psi) versus the wafer thickness for a 1.25" diameter 5.5/56/44 PLZT device according to the present invention. The wafer was heat treated at 975° C. for 60 minutes to produce the RAINBOW device. As shown in FIG. 12, a 10 mil thick wafer can produce up to 500% strain (i.e., 50 mil displacement from the 10 mil wafer). The electric field used to produce such a strain was ±45 V/mil. As also shown in FIG. 12, the present ceramic devices can operate in a dome mode (preferred), saddle mode or mixed mode depending on the thickness to diameter ratio of the wafer 26. In the dome mode, during the application of a pulsing voltage, the wafer 26 shrinks in and expands out radially and equally from all points on the wafer 26. Although the dome mode is preferred, the present ceramic devices can also be usefully operated in the saddle and mixed modes. In the saddle mode, (single axis extensional mode) under an applied voltage, the wafer 26 shrinks in and expands out along one major direction of the diameter of wafer 26 rather than along all radial directions equally. The mixed mode region is somewhere in between the dome and saddle mode regions.

Figure 13:
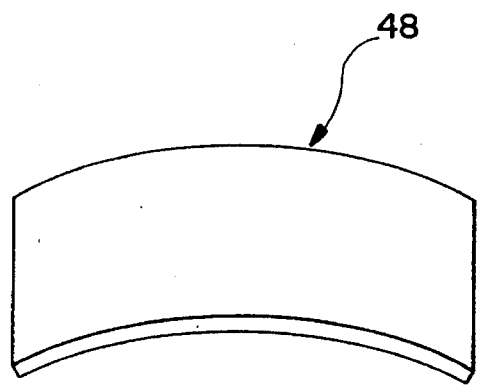
FIGS. 13–14 are top perspective views of further embodiments of the electrically active ceramic devices of the present invention.
Figure 14:
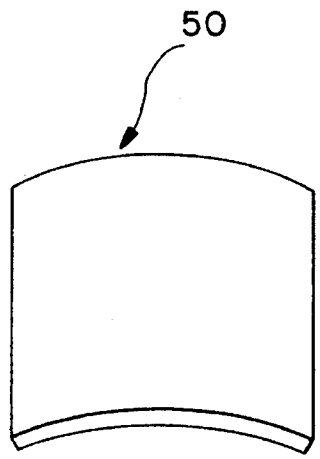

Although the above description was described with reference to a circular wafer 10, the process of the present invention can also be applied to any other shapes such as, for example, the rectangular, square, rectangular or square cross-sectional or odd shaped elements 16, 18, and 19 shown in FIGS. 2–4. When the starting wafer has a rectangular or square shape, the process of the present invention will produce a concave shaped rectangular 48 or square 50 device as shown in FIGS. 13–14. The cross-sectional views of devices 48 and 50 are identical to the cross-sectional views of the wafer 26 shown, for example, in FIG. 6. By applying at least one electrode to the dielectric (unreduced) side 27 the devices 48 and 50 can be used as benders. The above discussion with regard to the reduced layer, deposited electrodes, strain/load characteristics, etc. of the circular wafer 26 is equally applicable to the devices 48 and 50 of FIGS. 13–14.

The electrically active ceramic devices of the present invention provide a monolithic, prestressed construction which make it able to produce high displacements and sustain moderate loads. The internal asymmetrical compressive strain present in the device of the present invention provides above-plane axial displacement and increased mechanical strength. Above-plane axial displacement makes the devices of the present invention more useful and versatile (e.g., a speaker can be fabricated simply by adhering the device to a sounder board or a pump) as compared to conventional in-plane devices. If a load greater than that which can be sustained is placed on a concave, dome or saddle shaped device of the present invention, the device will flatten out and be inoperable. However, when the overload is removed the device will return to its concave, dome or saddle shape and again operate as required thereby providing a built in safety measure for mechanical overloads. In contrast therewith, a conventional bimorph will crack or break with an overload and must be replaced.

Referring to FIG. 15, there is shown a comparison of ceramic actuator technologies. As shown therein, although direct extensional and flextensional devices can sustain larger loads, they cannot sustain much strain. Conversely, bimorphs can produce a large strain but with greatly reduced loads. However, the RAINBOW devices of the present invention can produce strains of up to several hundred percent which is an order of magnitude greater than bimorphs and sustain loads of at least ten pounds which is an order of magnitude greater than the best bimorphs. Thus, the present invention provides a monolithic prestressed electrically active ceramic device which can sustain a very high axial strain, can handle moderate loads, provides mechanical overload protection, is easy to fabricate and cost effective.

The electrically active piezoelectric or electrostrictive devices of the present invention exhibit a number of useful properties such as piezoelectric, electrostrictive, pyroelectric, ferroelectric and electrooptic. In addition, the devices of the present invention are surface mountable for hybrid devices, have a low inventory of parts, no bonding requirement, are highly flexible and multifunctional. As a result, the present ceramic devices can be used for a wide variety of applications including actuators, relays, pumps, shakers, speakers, accelerometers, sensors (stress/pressure, pyroelectric, motion, optical), pyroelectric detectors, switches, ultrasonic cleaners, ultrasonic drills, filters, fans, thin film devices, sounders, microphones, hydrospeakers, hydrophones, adaptive optics, variable focus mirrors and lenses, displacement devices, vibrator, pulse/echo devices, robotic handlers, strain gauges, saddle inchworm and printer hammers.

When a circular wafer 10 is used, the present method produces a substantially dome shaped wafer 26 as described above. Since each individual device 26 approximates one-half of a clamshell structure, two of them can be placed together to form a completed clamshell device 52 as shown in FIG. 16. The device 52 includes first and second ceramic devices 54, 56 respectively having first and second electrodes 30, 32. The two inner electrodes 32 of each device is in contact with a rigid conductive sheet 58 (e.g., a metal sheet) which can be connected to a negative terminal 60. (It should be noted that electrode 32 is optional and reduced layer 28 can be used as the electrode.) The conductive sheet 58 can be disposed loosely between the devices 54 and 56 or it can be bonded to each of devices 54 and 56. The two outer electrodes 30 are connected to each other by wire 62 and to base 64 forming a ground terminal 66. No special connection or adhesive is required between devices 54 and 56 and conductive sheet 58 which can be simply placed on top of each other. In operation, the upper device 54 provides above-plane axial displacement while the lower device 56 provides below-plane axial displacement. The two RAINBOW devices 54 and 56 can be operated in series to produce twice the displacement of one unit.

As an alternative embodiment, the non-flexible conductive sheet 58 can be removed and devices 54 and 56 can simply be placed on top of each other. In this embodiment, the two inner electrodes 32 (or reduced layers 28) will be directly in contact with each other and terminal 60 can be directly connected to one of the electrodes 32 (or reduced layers 28). In either of the above embodiments (i.e., with or without the rigid sheet 58), the devices 54 and 56 can be bonded to each other or to conductive sheet 58 by an epoxy sandwiched between the devices around the inner perimeter thereof, making sure that electrical contact is maintained.

Figure 17:
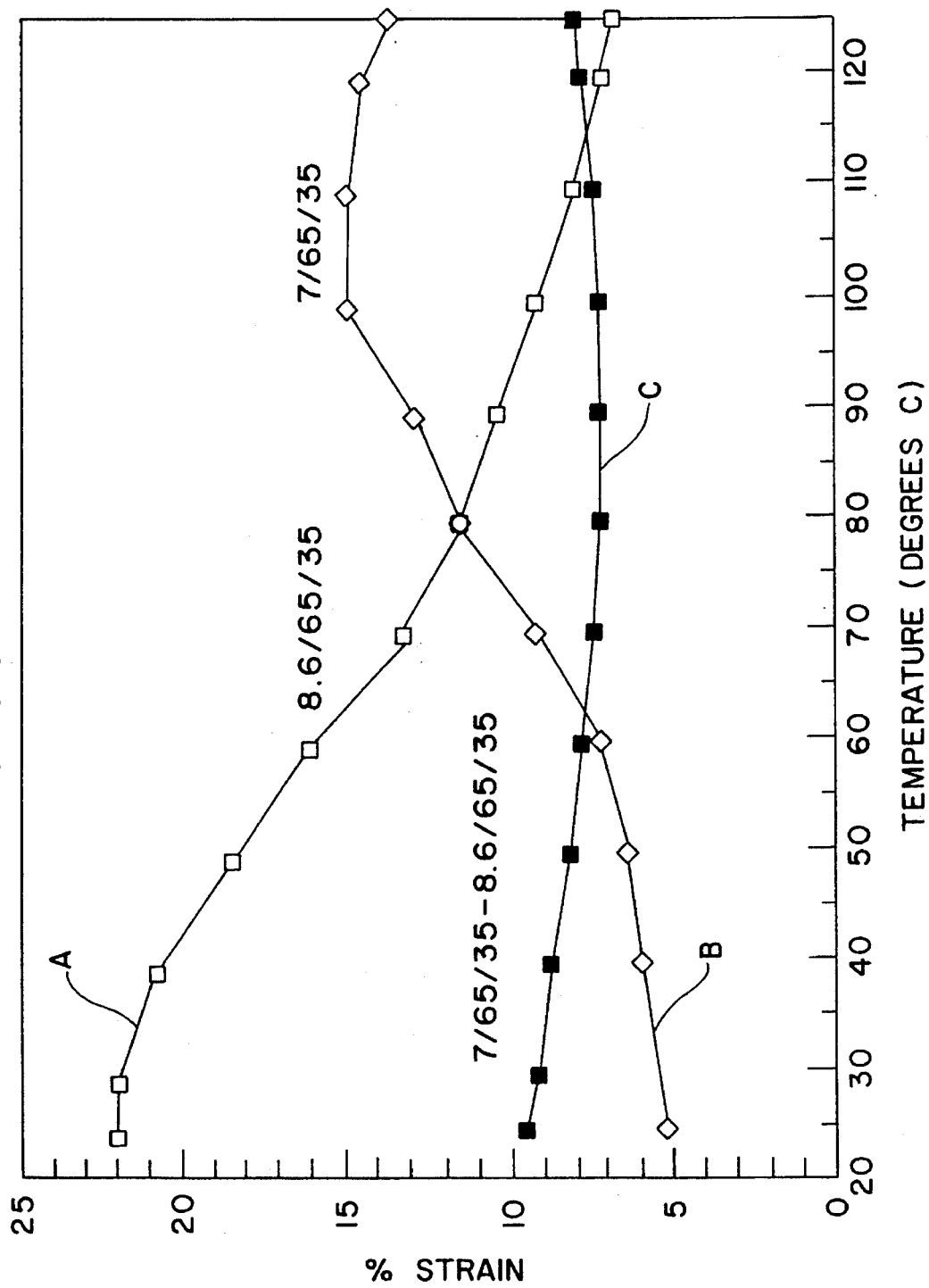
FIG. 17 is a graph of the temperature/strain characteristics of two ceramic elements of the present invention which can be operated as an athermalized device.

In another embodiment of the present invention, each of the ceramic devices 54 and 56 shown in FIG. 16 can have opposing temperature characteristics to produce an athermalized clamshell device 52. Referring to FIG. 17, there is shown the temperature/strain characteristics of two ceramic devices of the present invention. As an illustrative example, the device 54 can be made of PLZT 8.6/65/35 having a strain which decreases as the temperature is increased as shown by curve A in FIG. 17. The device 56 can be made of PLZT 7/65/35 having an opposing temperature/strain characteristic shown by curve B in FIG. 17 wherein the strain increases as the temperature is increased. When the two devices 54 and 56 are combined as a clamshell structure 52, the resulting temperature/strain characteristic of the overall device 52 is athermalized as shown by curve C in FIG. 17. In other words, the strain characteristic for the clamshell device 52 is substantially independent of temperature. Thus, this embodiment of the present invention has, in addition to all the advantages stated above, the added advantage of temperature stabilization.

In a further embodiment, the clamshell devices 52 can be cascaded as shown in FIG. 18. As an illustrative example, FIG. 18 shows three clamshell devices 52 stacked on top of each other to form a pump or motor 68 of high linear displacement in a very small volume. It should be understood that device 68 can comprise 2 or more clamshell devices. Each of the outer electrodes 30 of each device 52 is connected to each other by wires 70, 72 and 74. The electrodes 30 are connected to base 76 and a terminal 78 defines a positive terminal. Each of the inner electrodes 32 of each of the three clamshell devices 52 are connected to each other by wires 80, 82 and 84 which are all connected to a negative terminal 86.

As an alternative embodiment, each of the clamshell devices 52 can be separated by a rigid conductive sheet 87. Each of the outer electrodes 30 of each device 52 can then be electrically connected to each other by means of rigid sheets 87 and wires 88, 90, and 92. It should be noted that wires 70, 72, and 74 are not required for this embodiment.

The above description of the device 52 in FIG. 16 with regard to the optional electrode 32, optional non-flexible conductive sheet 58 and bonding applies equally to each device 52 in FIG. 18. In addition, each of the devices 52 in FIG. 18 can be athermalized as described above to produce an athermalized pump or motor 68.

Figure 19:
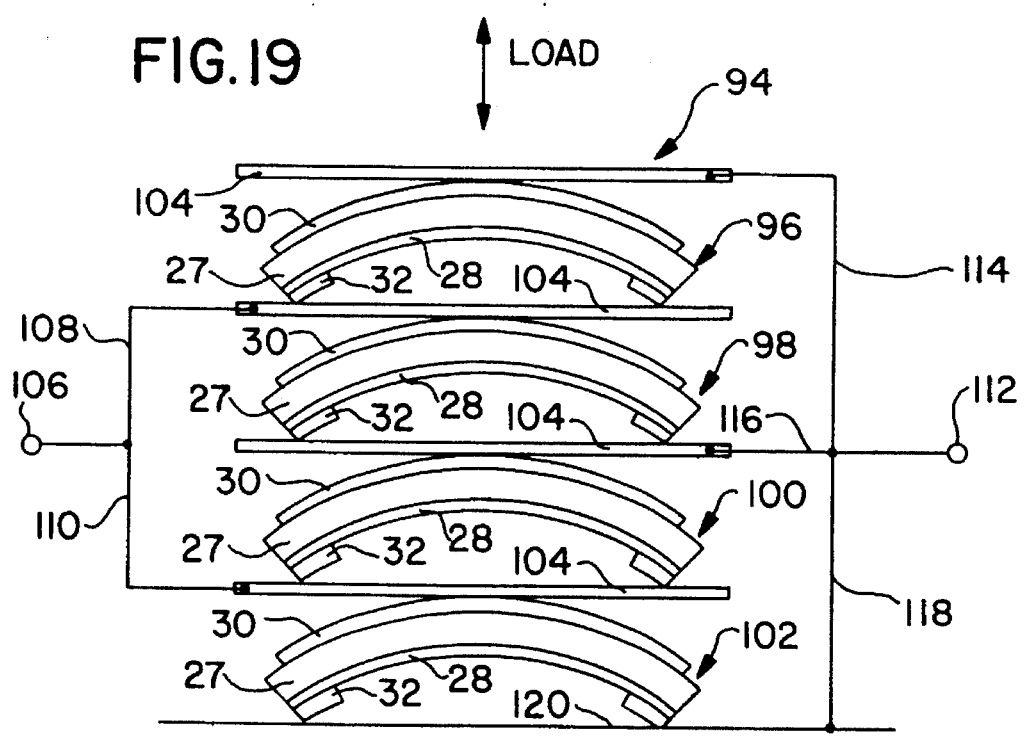
FIGS. 19–20 are cross-sectional views of multiple ceramic devices according to further embodiments of the present invention.

In a further embodiment of the present invention, two or more of the ceramic wafers 26 can be placed on top of each other to form an accordion type device 94 as shown in FIG. 19, which can be, for example, a pump, motor or actuator. As an illustrative example, the device 94 includes first, second, third and fourth ceramic devices 96, 98, 100 and 102 respectively, with each device having first and second electrodes 30 and 32. (It should be noted that electrodes 32 are optional and reduced layer 28 can be used as the second electrode for each of the devices 96, 98, 100 and 102.) As shown in FIG. 19, each of the ceramic elements 96, 98, 100 and 102 are stacked on top of each other such that the first surface 12 of any of the ceramic elements is facing the second surface 14 of any adjacent ceramic element.

Each of the four ceramic devices are separated by a rigid conductive sheet 104. Since the ceramic devices of the present invention are bipolar, the electrical connections for operating device 94 can be as shown in FIG. 19. The first electrodes 30 of devices 98 and 102 and the second electrodes 32 of devices 96 and 100 are all connected to a terminal 106 by means of wires 108 and 110 and two of the conductive sheets 104. The terminal 106 can be a negative terminal. The second electrodes 32 of devices 98 and 102 and the first electrodes of device 96 and 100 are connected to a terminal 112 by means of wires 114, 116, 118, metallic base 120 and two of the conductive sheets 104. The terminal 112 can be a positive terminal.

Figure 20:
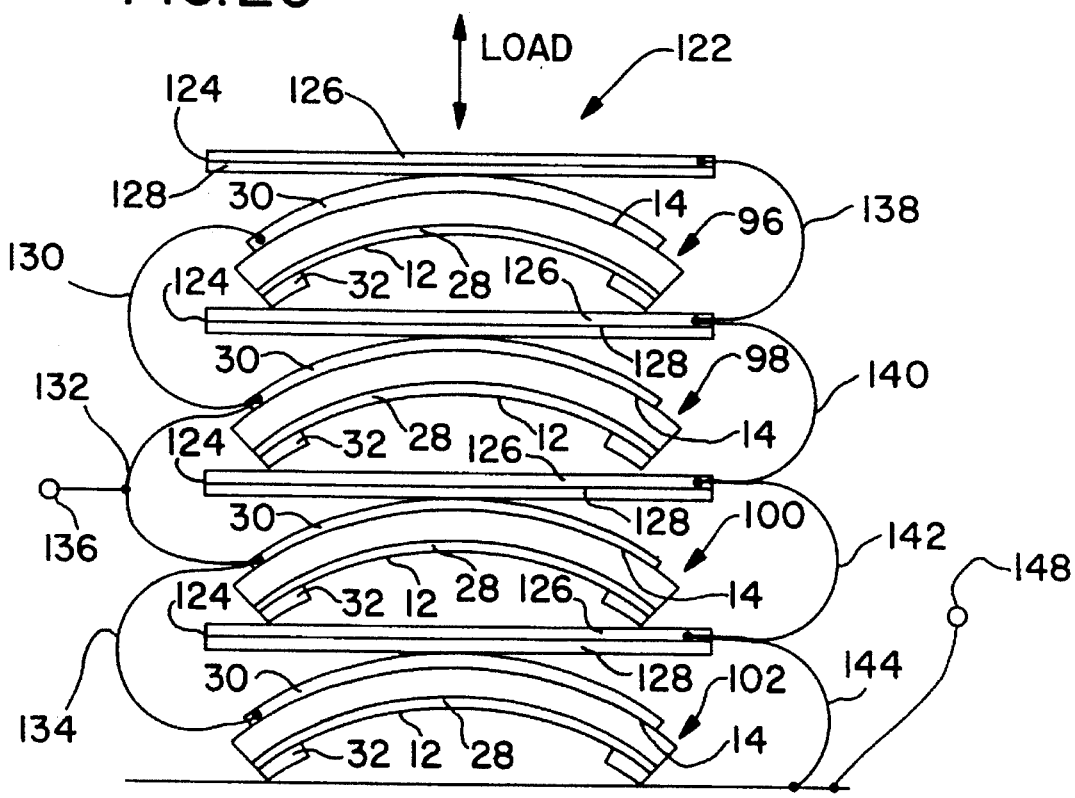

Another embodiment of an accordion type device of the present invention is shown in FIG. 20 and can also be operated as a pump, motor or actuator. In the device 122, each of the four ceramic elements 96, 98, 100 and 102 are separated by a rigid sheet 124 which includes a conductive portion 126 and an insulator portion 128. Each of the outer electrodes 30 of each device is connected to each other by wires 130, 132 and 134. The electrodes 30 are then connected to a terminal 136 which defines a positive terminal. Each of the inner electrodes 32 of each of the four devices 96, 98, 100 and 102 are connected to each other by means of wires 138, 140, 142 and 144, conductive portions 126 of rigid sheets 124 and metallic base 146 which are all connected to a negative terminal 148.

With regard to each of accordion type devices 94 and 122, the rigid sheets 104 and 124 can be disposed loosely between each of the devices 96, 98, 100 and 102 or they can be bonded to each device by placing a bonding means (e.g., epoxy) on each surface of each rigid sheet 104 and 124. As an alternative embodiment of each of the devices 94 and 122, each pair of devices (96, 98) and (100, 102) can be athermalized as described above to produce an athermalized device 94 or 122. It is to be understood that for an athermalized device, the device 94 or 122 can be comprised of n number of pairs of devices where n=1, 2 . . . .

While the invention has been particularly shown and described with respect to preferred embodiments thereof, it should be understood by those skilled in the art that the foregoing and other changes in form and detail may be made therein without departing from the spirit and scope of the invention which should be limited only by the scope of the appended claims.

What is claimed is:

1. A method for fabricating a ceramic element comprising the steps of:
   (a) forming a ceramic element having first and second opposing surfaces; and
   (b) chemically reducing only said first surface by exposing only said first surface to a reducing atmosphere to produce an internally asymmetrically stress biased ceramic element wherein said first surface is an electrically conductive reduced form of said ceramic element and is in tension and said second surface is in compression.

2. The method of claim 1, wherein said chemical reducing step includes producing a ceramic element wherein said first surface is concave shaped.

3. The method of claim 1, wherein said chemical reducing step includes heating said ceramic element.

4. The method of claim 3, wherein said chemical reducing step includes exposing said ceramic element to a temperature between 600° C. to 1200° C. for a time ranging from 5 minutes to 24 hours.

5. The method of claim 1, wherein said reducing atmosphere comprises a reducing agent selected from the group consisting of carbon, carbon monoxide and hydrogen.

6. The method of claim 1, wherein said chemical reducing step comprises:
   placing said ceramic element on a carbon block such that said first surface is in contact with said carbon block; and
   heating said structure.

7. The method of claim 6, wherein said second surface is exposed to a non-reducing atmosphere.

8. The method of claim 6, further including the steps of:
   placing a masking block on top of said second surface such that said ceramic element is sandwiched between said carbon and masking blocks; and
   heating said sandwiched structure.

9. The method of claim 8, wherein said masking block is comprised of a material selected from the group consisting of zirconia and magnesia.

10. The method of claim 1, further including the step of forming a first electrode on said second surface of said ceramic element.

11. The method of claim 10, further including the step of forming a second electrode on a perimeter of said first surface of said ceramic element.

12. The method of claim 10, further including the step of forming a second electrode over the entire first surface of said ceramic element.

13. The method of claim 11, further including the step of applying a DC, pulsing or AC voltage at a frequency to said first and second electrodes such that said ceramic element displaces in accordance with the frequency of the applied voltage.

14. The method of claim 13, further including the step of operating said ceramic element as a device selected from the group consisting of an actuator, pump, sensor, and speaker.

15. The method of claim 13, wherein said ceramic element has a thickness between 0.5 and 500 mils, and a diameter between 0.05 and 10,000 mils.

16. The method of claim 15, wherein said voltage produces an electric field between +1 V/mil and +200 V/mil and said displacement is between 0.1 mil and 100 mil.

17. The method of claim 1, wherein said ceramic element is formed by hot pressing or atmosphere sintering.

18. The method of claim 1, wherein said ceramic element is formed into a shape selected from the group consisting of circular, rectangular, square and odd.

19. The method of claim 1, wherein said ceramic element is a circular wafer and said chemical reducing step produces a substantially dome shaped ceramic element.

20. The method of claim 1, wherein said ceramic element is a circular wafer and said chemical reducing step produces a substantially saddle shaped ceramic element.

21. The method of claim 1, wherein the ceramic wafer is a material selected from the group consisting of PZT, PLZT, PSZT, PMN and PBZT.

* * * * *

UNITED STATES PATENT AND TRADEMARK OFFICE
CERTIFICATE OF CORRECTION

PATENT NO.  : 5,471,721
DATED       : December 5, 1995
INVENTOR(S) : Gene H. Haertling It is certified that error appears in the above-indentified patent and that said Letters Patent is hereby corrected as shown below:

On the Title Page, Section [56], Column 2, line 14:
"pp. 21 . 50." should read --pp. 21-50.--
Column 1, line 3, insert the following:
--The present research project was supported by a grant from the National Aeronautics and Space Administration (NASA), Grant No. NAG-1-1301.--
Column 2, line 23: before "transducer" delete --.--
Column 9, line 17: "42and" should read --42 and--
Column 14, line 25, Claim 16: " +1 " and " +200 " shoul read -- ±1 -- and -- ±200 --

Signed and Sealed this

Eleventh Day of June, 1996

Attest:

BRUCE LEHMAN

*Attesting Officer*     Commissioner of Patents and Trademarks